United States Patent
Lee

(10) Patent No.: US 9,917,275 B2
(45) Date of Patent: Mar. 13, 2018

(54) DISPLAY APPARATUS

(71) Applicant: Samsung Display Co., Ltd., Yongin-si (KR)

(72) Inventor: Sangshin Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/421,608

(22) Filed: Feb. 1, 2017

(65) Prior Publication Data

US 2017/0141343 A1    May 18, 2017

Related U.S. Application Data

(63) Continuation of application No. 15/012,391, filed on Feb. 1, 2016, now Pat. No. 9,595,690.

(30) Foreign Application Priority Data

Jul. 21, 2015  (KR) .......................... 10-2015-0103011

(51) Int. Cl.
| | | |
|---|---|---|
| *H01L 51/52* | (2006.01) | |
| *H01L 23/544* | (2006.01) | |
| *H01L 27/32* | (2006.01) | |

(52) U.S. Cl.
CPC .......... *H01L 51/524* (2013.01); *H01L 23/544* (2013.01); *H01L 27/3244* (2013.01); *H01L 2223/54426* (2013.01)

(58) Field of Classification Search
CPC ............................ H01L 51/524; H01L 23/544
See application file for complete search history.

(56) References Cited

U.S. PATENT DOCUMENTS

| | | | |
|---|---|---|---|
| 9,595,690 B2 * | 3/2017 | Lee | .................. H01L 51/524 |
| 2006/0141737 A1 | 6/2006 | Gaidis | |
| 2006/0292833 A1 | 12/2006 | Matsushita | |
| 2007/0126334 A1 | 6/2007 | Nakamura et al. | |
| 2012/0320502 A1 | 12/2012 | Jung et al. | |
| 2014/0033974 A1 | 2/2014 | Hong et al. | |
| 2014/0159078 A1 | 6/2014 | Kim | |

FOREIGN PATENT DOCUMENTS

| | | |
|---|---|---|
| KR | 10-2006-0060931 | 6/2006 |
| KR | 10-2007-0036188 | 4/2007 |
| KR | 10-2012-0139392 | 12/2012 |
| KR | 10-2014-0017767 | 2/2014 |
| KR | 10-2014-0075467 | 6/2014 |

OTHER PUBLICATIONS

Notice of Allowance dated Nov. 1, 2016 in U.S. Appl. No. 15/012,391.

\* cited by examiner

*Primary Examiner* — Dung Le
(74) *Attorney, Agent, or Firm* — H.C. Park & Associates, PLC

(57) ABSTRACT

A display apparatus including a substrate having an active area and a sealing area surrounding the active area; a display unit disposed on the active area of the substrate; a sealing member including a recess, which is formed in the sealing area of the substrate and is concave in a direction from an edge of the substrate to the active area of the substrate or from the active area of the substrate to the edge of the substrate; and an alignment mark disposed between the recess and the edge of the substrate or between the recess and the active area of the substrate.

9 Claims, 8 Drawing Sheets

DISPLAY APPARATUS

CROSS-REFERENCE TO RELATED APPLICATION

This application is a continuation of U.S. patent application Ser. No. 15/012,391, filed on Feb. 1, 2016, and claims priority from and the benefit of Korean Patent Application No. 10-2015-0103011, filed on Jul. 21, 2015, which is hereby incorporated by reference for all purposes as if fully set forth herein.

BACKGROUND

Field

Exemplary embodiments relate to a display apparatus.

Discussion of the Background

The market for display apparatuses, which may include media that allow users to communicate with each other and access information, has expanded with the development of information technology. Various kinds of display apparatuses have been developed, and organic light-emitting display (OLED) apparatuses have particularly attracted attention due to their good performance, small thickness, light weight, and low power consumption.

An organic light-emitting display apparatus may include pixels and OLEDs. The degree of light emission of each OLED may be controlled by a thin-film transistor (TFT). Such OLEDs may include a pixel electrode electrically connected to a TFT, a counter electrode facing the pixel electrode, and an intermediate layer between the pixel electrode and the counter electrode and including an organic emission layer.

One of the methods for forming the organic emission layer included in the intermediate layer may include a deposition method using a mask. That is, organic materials evaporated from vapor deposition sources may pass through openings in the mask to be deposited on a substrate, thereby forming the organic emission layer. Therefore, in order for the organic materials to be deposited at the proper position in the deposition process, it is very important to precisely position the mask with regard to the substrate.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide an organic light-emitting display apparatus that may secure a precise mask position with regard to a substrate.

Additional aspects will be set forth in part in the description which follows and, in part, will be apparent from the disclosure, or may be learned by practice of the inventive concept.

An exemplary embodiment discloses a display apparatus including a substrate having an active area and a sealing area surrounding the active area; a display unit disposed on the active area of the substrate; a sealing member having a recess formed in the sealing area of the substrate and being concave in a direction from an edge of the substrate to the active area of the substrate or from the active area of the substrate to the edge of the substrate; and an alignment mark disposed between the recess and the edge of the substrate or between the recess and the active area of the substrate.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
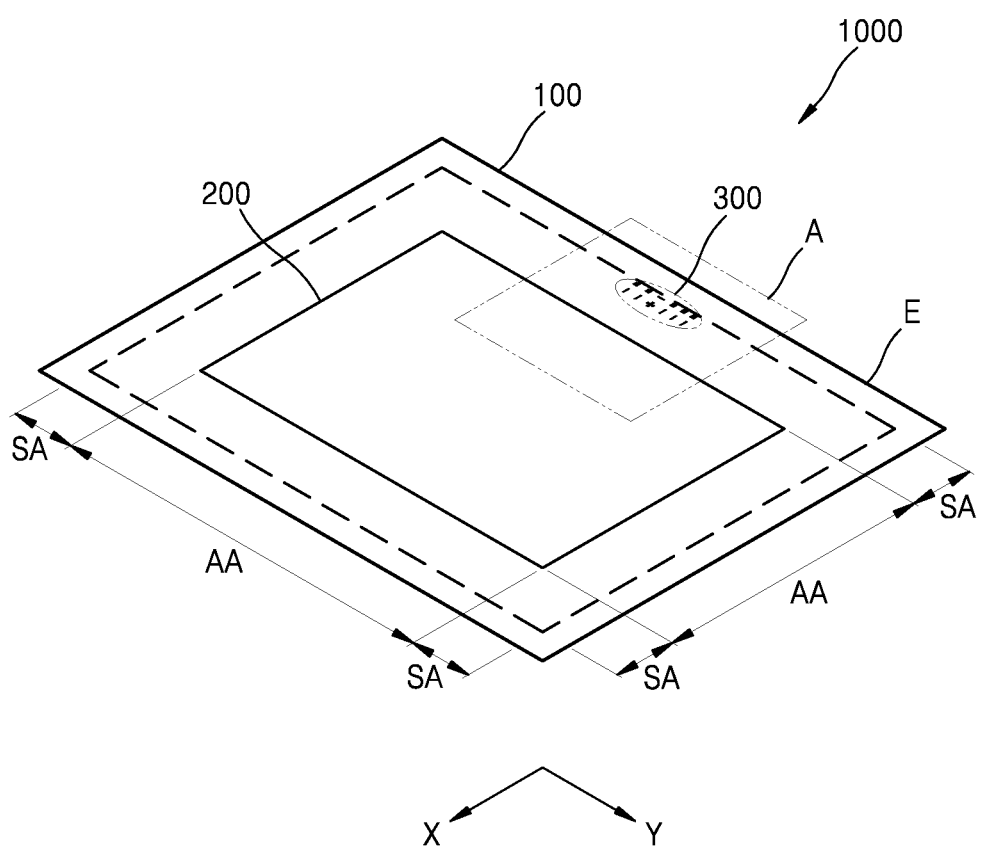
FIG. 1 is a schematic perspective view of a substrate for a display apparatus, according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. The regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

FIG. 1 is a schematic perspective view of a substrate for a display apparatus 1000, according to an exemplary embodiment.

Referring to FIG. 1, the display apparatus 1000 may include a substrate 100, a display unit 200, and an alignment mark 300.

The substrate 100 may include an active area AA and a sealing area SA.

The active area AA is an area in which an image is displayed to the outside of the display apparatus 1000, and the sealing area SA is an area in which an image is not displayed and which may surround the active area AA.

The alignment mark 300 may be disposed on at least one portion of the sealing area SA. That is, the alignment mark 300 may be disposed on the sealing area SA, or may be disposed over the sealing area SA and outside the sealing area SA.

The display unit 200 may be disposed on the active area AA. The display unit 200 may include one or more thin film transistors (TFTs) and display devices electrically connected to the TFTs. The display devices may be one or more suitable display devices according to the type of the display apparatus 1000. However, hereinafter the use of organic light-emitting devices (OLEDs) will be described.

Figure 2:
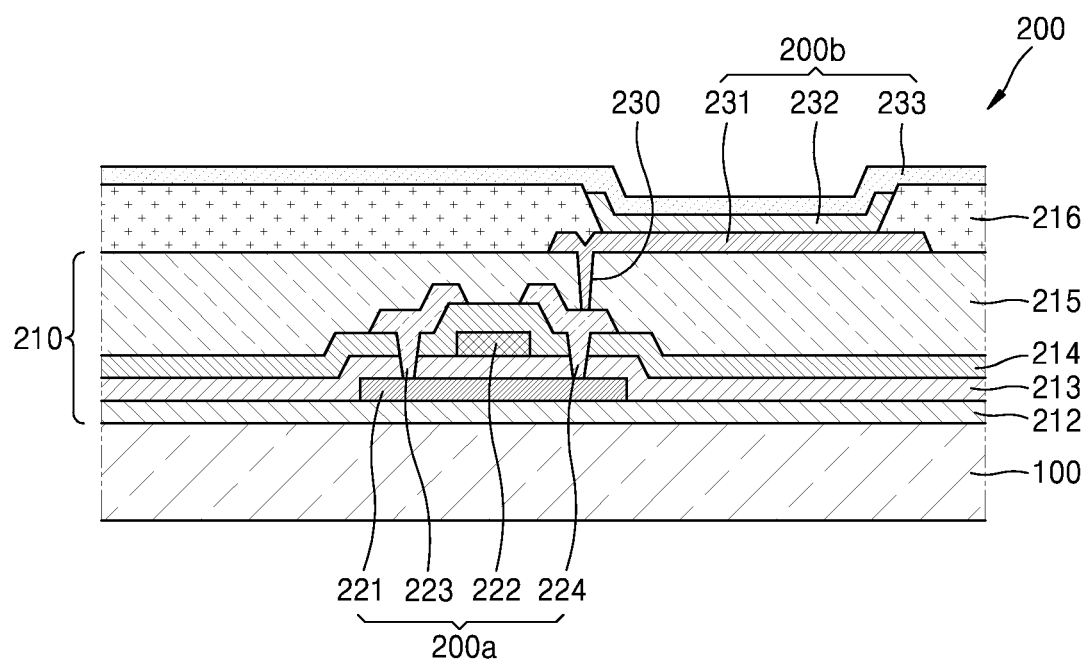
FIG. 2 is a schematic cross-sectional view of a pixel on a substrate shown in FIG. 1.

FIG. 2 is a schematic cross-sectional view of a pixel on the substrate 100 shown in FIG. 1.

The substrate 100 may include various materials, e.g., a glass material, a metal material, or a plastic material. When the display apparatus 1000 is a bottom emission-type display apparatus, in which an image is displayed to the direction of the substrate 100, the substrate 100 may include a transparent material. On the other hand, when the display apparatus 1000 is a top emission-type display apparatus, in which an image is displayed away from the substrate 100, the substrate 100 may not necessarily include a transparent material.

A buffer layer 212 may be formed on the substrate 100. The buffer layer 212 may prevent impure elements from permeating the substrate 100, may provide a flat surface on the substrate 100, and may include various materials capable of performing such functions. For example, the buffer layer 212 may include inorganic materials, such as silicon oxide ($SiO_x$), silicon nitride ($SiN_x$), and silicon oxynitride ($SiO_xN_y$).

An active layer 221 may be formed on the buffer layer 212 of an inorganic semiconductor material, such as silicon, or an organic semiconductor material. The active layer 221 may include a source area, a drain area, and a channel area between the source area and drain area. For example, when the active layer 221 is formed of amorphous silicon, the active layer 221 including the source area, the drain area, and the channel area between the source area and drain area may be formed by forming and crystallizing an amorphous silicon layer on an entire surface of the substrate 100, forming a polycrystalline silicon layer, patterning the polycrystalline silicon layer, and respectively doping a source area and a drain area at respective edges of the polycrystalline silicon layer with impurities.

A gate insulating film 213 may be formed on the active layer 221. The gate insulating film 213 may be used to insulate the active layer 221 from a gate electrode 222. The gate insulating film 213 may include an inorganic material, such as $SiN_x$, $SiO_2$, etc.

The gate electrode 222 may be formed on the gate insulating film 213. The gate electrode 222 may be connected to a gate line (not shown) transmitting on/off signals of the TFT.

The gate electrode 222 may contain gold (Au), silver (Ag), copper (Cu), nickel (Ni), platinum (Pt), palladium (Pd), aluminum (Al), and molybdenum (Mo), and may include an alloy, such as an Al:Nd alloy, an Mo:W alloy, etc., but is not limited thereto. The gate electrode 222 may include various materials by taking into account various design considerations.

An interlayer insulating film 214, formed on the gate electrode 222, may be used to insulate the gate electrode 222, a source electrode 223, and a drain electrode 224 from one another. The interlayer insulating film 214 may include an inorganic material such as $SiN_x$, $SiO_2$, etc.

The source electrode 223 and the drain electrode 224 may be formed on the interlayer insulating film 214. In more detail, the interlayer insulating film 214 and the gate insulating film 213 may expose parts of the source area and the drain area of the active layer 221, and the source electrode 223 and the drain electrode 224 may respectively contact the exposed parts of the source area and the drain area of the active layer 221.

Although a top gate-type TFT, in which the gate electrode 222, the source electrode 223, and the drain electrode 24 are sequentially formed, is illustrated in FIG. 2, the exemplary embodiments are not limited thereto. The gate electrode 222 may be disposed below the active layer 221.

A TFT 200*a* may be electrically connected to OLEDs 200*b* to drive the OLEDs 200*b*, and may be protected by being covered by a protective film 215.

The protective film 215 may include a general-purpose polymer, such as polymethyl methacrylate (PMMA) or polystyrene (PS), a polymeric derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, or a mixture thereof.

The OLEDs 200*b* may each include a pixel electrode 231, an intermediate layer 232, and a counter electrode 233.

The pixel electrode 231 may be formed on the protective film 215, and may be electrically connected to the drain electrode 224 via a contact hole 230 which is formed in the protective film 215.

The pixel electrode 231 may be a transparent (translucent) electrode or a reflective electrode. When the pixel electrode 231 is the transparent (translucent) electrode, the pixel electrode 231 may include indium tin oxide (ITO), indium zinc oxide (IZO), zinc oxide (ZnO), indium oxide ($In_2O_3$), indium gallium oxide (IGO), or aluminum zinc oxide (AZO). When the pixel electrode 231 is a reflective electrode, the pixel electrode 231 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or a compound thereof, and a layer including ITO, IZO, ZnO, $In_2O_3$, IGO, or AZO. However, the pixel electrode 231 is not limited thereto and may include various other materials. Also, the pixel electrode 231 may have either a single-layer structure or a multilayer structure.

The counter electrode 233 facing the pixel electrode 231 may be a transparent (translucent) electrode or a reflective electrode. When the counter electrode 233 is a transparent (translucent) electrode, the counter electrode 233 may include a layer including metals having a low work function, such as lithium (Li), calcium (Ca), lithium fluoride/calcium (LiF/Ca), lithium fluoride/aluminum (LiF/Al), aluminum (Al), magnesium (Mg), or a combination thereof, and a transparent (translucent) layer including ITO, IZO, ZnO, $In_2O_3$, or the like. When the counter electrode 233 is a reflective electrode, the counter electrode 233 may include a layer including Li, Ca, LiF/Ca, LiF/Al, Al, Mg, or a combination thereof. Structures and materials of the counter electrode 233 are not limited thereto and may vary.

Thus, the counter electrode 233 may allow light emitted from an organic emission layer (not shown) included in the intermediate layer 232 to pass through. That is, the light emitted from the organic emission layer (not shown) may be reflected directly or via the pixel electrode 231, which is a reflective electrode, and may be emitted toward the counter electrode 233.

However, the display apparatus 1000 of the present exemplary embodiment is not limited to a top emission-type, and may instead be a bottom emission-type in which the light emitted from the organic emission layer (not shown) is emitted toward the substrate 100. In this case, the pixel electrode 231 may be a transparent or semi-transparent electrode, and the counter electrode 233 may be a reflective electrode. The organic light-emitting display apparatus 1000 of the present embodiment may also be a dual emission-type in which light is emitted in both directions of front and bottom surfaces thereof.

A pixel-defining film 216 may be formed on the first electrode 231 as an insulating material. The pixel-defining film 216 may include at least one organic insulating material selected from polyimide, polyamide, acryl resin, benzocyclobutene (BCB), and phenol resin, by spin coating, or the like. The pixel-defining film 216 may expose a region of the pixel electrode 231, and the intermediate layer 232 with the organic emission layer may be located on the exposed region of the pixel electrode 231.

The intermediate layer 232 may selectively further include a functional layer, such as a hole transport layer (HTL), a hole injection layer (HIL), an electron transport layer (ETL), an electron injection layer (EIL), etc., in addition to the organic emission layer.

The organic emission layer (not shown) included in the intermediate layer 232 may include a low molecular weight organic material or a high molecular weight organic material. Examples of the low molecular weight organic material may include copper phthalocyanine (CuPc), N,N'-Di(naphthalene-1-yl)-N,N'-diphenyl-benzidine (NPB), and tris-8-hydroxyquinoline aluminum (Alq3). Examples of the high molecular weight organic material may include a polyphenylenevinylene (PPV)-based material and a polyfluorene-based material.

There are various methods of forming the organic emission layer. For example, the low molecular weight organic material or the high molecular weight organic material may be vacuum-deposited to form the organic emission layer. The organic emission layer may be formed along with the pixel electrode 231 and the counter electrode 233, and various functional layers of the intermediate layer 232, or separately. Hereinafter it will be described that the organic emission layer is formed separately from an electrode layer and a functional layer for convenience of explanation.

In order to form the organic emission layer by vacuum deposition, a deposition mask having openings corresponding to the pattern of the organic emission layer may be used. The deposition mask may be disposed in close contact with the substrate 100 via a supporting implement, such as a vacuum suction implement and a magnet unit. In order to align the deposition mask with the substrate 100, the alignment mark 300 may be disposed on a surface of the substrate 100, as shown in FIG. 1. The alignment mark 300 will be described in detail with reference to FIG. 3.

The deposition mask may be a plate-shape member that has openings corresponding to the pattern of the object to be deposited. A material of the deposition mask may be a metal material, such as a metal of an alloy, a functional polymer, or a mixture of a polymer and a metal. The openings of the deposition mask may penetrate the deposition mask and include one or more slits.

The pixel electrode 231, the intermediate layer 232, and the counter electrode 233 may be sequentially formed, followed by sealing the substrate 100 and an encapsulation substrate (not shown). The method of sealing the substrate 100 and the encapsulation substrate may include disposing a sealing member 400 between the substrate 100 and the encapsulation substrate, and then compressing the substrate 100 and the encapsulation substrate. The encapsulation substrate may have a form similar to that of the substrate 100. Hereinafter, the sealing member will be described with reference to FIGS. 3 to 5.

Figure 3:
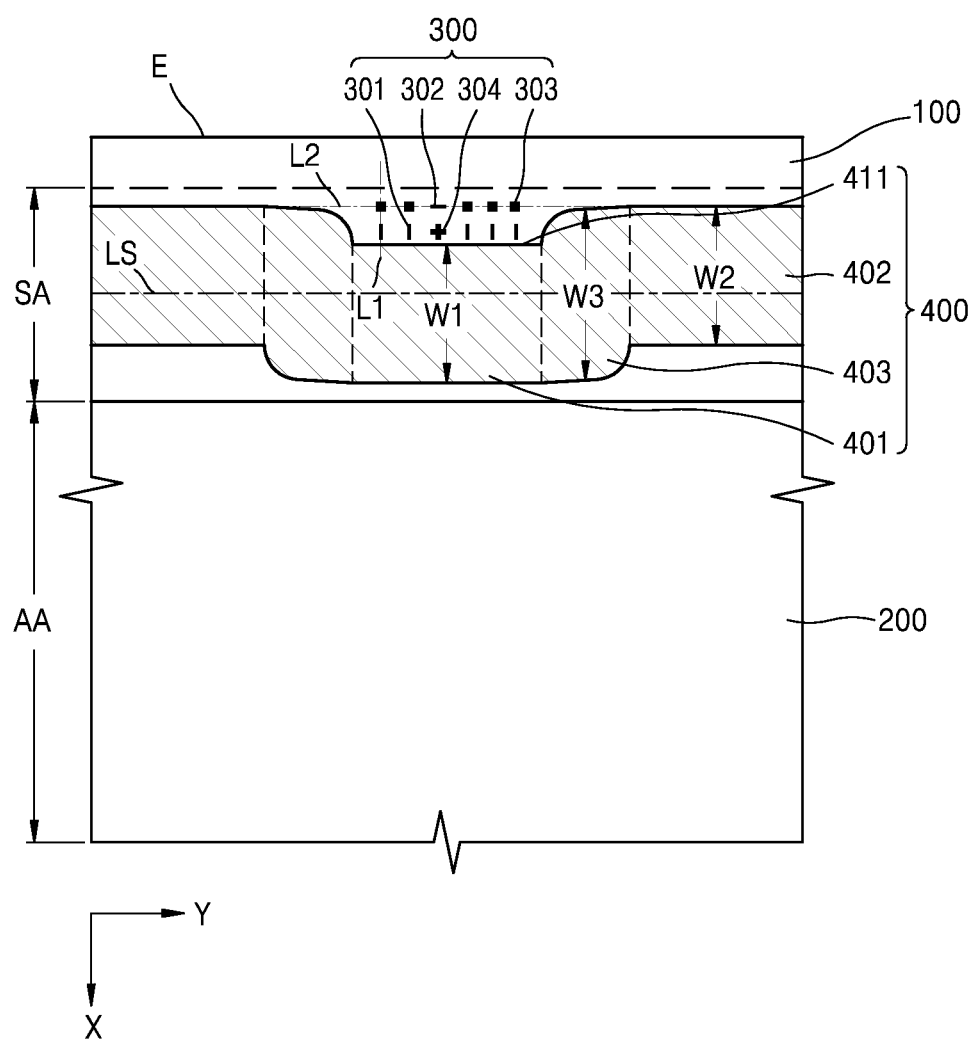
FIG. 3 is a schematic enlarged view of region A illustrated in FIG. 1.
Figure 4:
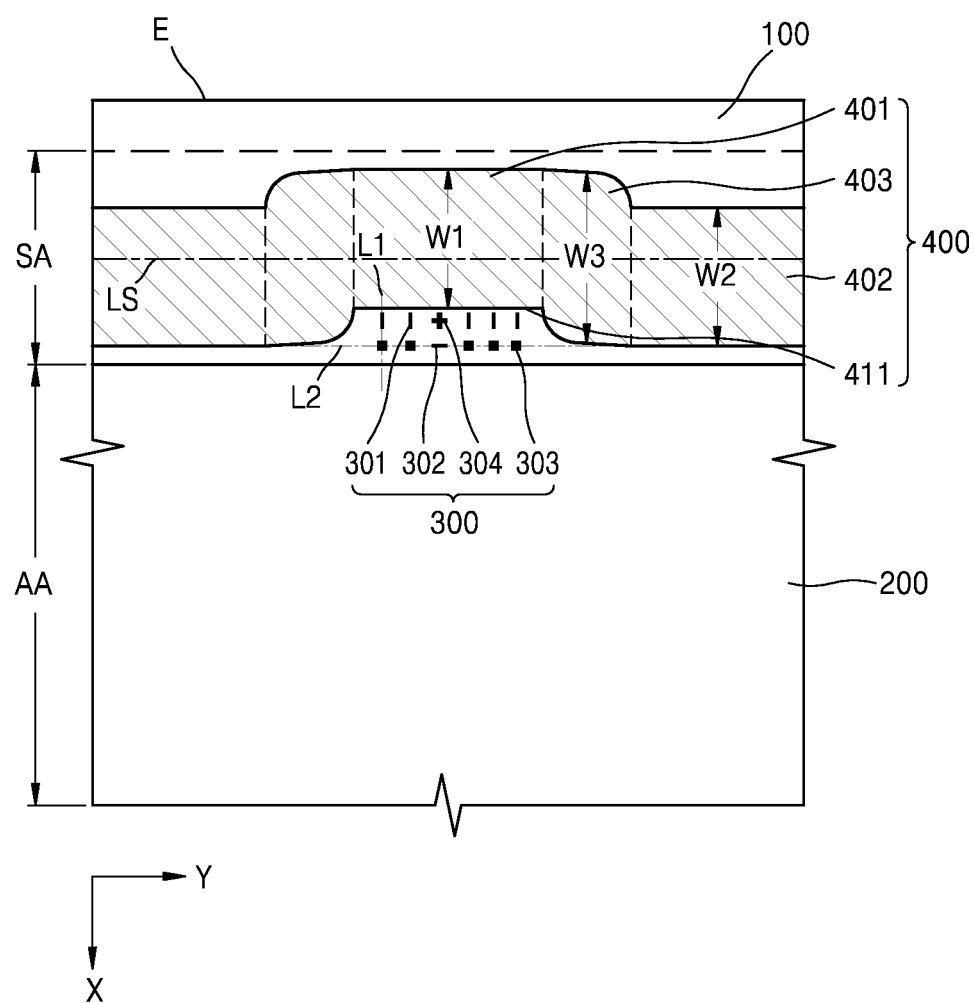
FIG. 4 is an enlarged schematic view of a portion of a display apparatus according to another exemplary embodiment of the inventive concept.

FIG. 3 is a schematic enlarged view of region A illustrated in FIG. 1. FIG. 4 is a schematic enlarged view of a portion of a display apparatus according to another exemplary embodiment of the inventive concept.

For convenience of explanation, the length direction of the sealing member 400 is indicated as the Y direction, and the width direction of the sealing member 400, which is perpendicular to the length direction, is indicated as the X direction.

Referring to FIG. 3, the sealing member 400 may be located on the sealing area SA, which is outside the active area AA of the substrate 100. The sealing member 400 seals a display unit from outside of the active area AA to thereby prevent impurities, such as moisture or air from outside, from permeating into the display unit.

For example, the sealing member 400 may include frit. The sealing member 400 may be formed by forming a paste including frit at the sealing area SA of the substrate 100, and then melting and hardening the paste including the frit. The frit may include vanadium oxide ($VO_2$) or bismuth oxide ($Bi_2O_3$), and may further include various materials, such as at least one of tellurium dioxide ($TeO_2$), zinc oxide (ZnO), barium oxide (BaO), niobium pentoxide ($Nb_2O_5$), silicon oxide ($SO_2$), aluminum oxide ($Al_2O_3$), zirconium oxide ($ZrO_2$), and phosphorus pentoxide ($P_2O_5$). The sealing member 400 may also include fillers including various materials to improve sealing properties.

The sealing member 400 may include a recess 411, which is concave in a direction from an edge E of the substrate 100 to the active area AA. For convenience of explanation, with regard to the sealing member 400, a portion where the recess 411 is located is referred to as a first portion 401, a portion adjacent to the first portion 401 is referred to as a second portion 402, and a portion between the first portion 401 and the second portion 402 is referred to as a third portion 403.

As shown in FIG. 3, a width W1 of the first portion 401 may be the same as a width W2 of the second portion 402. As the sealing member 400 is first curved from the Y direction to the X direction, and then curved from the X direction to the Y direction, a width W3 of the third portion 403 connecting the first portion 401 and second portion 402 may be greater than the width W1 of the first portion 401 and the width W2 of the second portion 402.

When the sealing member 400 is formed in such a shape, the alignment mark 300 for aligning the substrate 100 with a deposition mask (not shown) may be disposed between the concave recess 411 of the sealing member 400 and the edge E of the substrate 100. Regarding the method of preparation, first, the substrate 100 having the alignment mark 300 formed thereon at a predetermined position may be prepared. After completely forming the display unit 200 on the substrate 100, the sealing member 400 between the alignment mark 300 and the display unit 200 may be formed. Accordingly, at least one portion of the alignment mark 300 may be on the sealing area SA, thus reducing a dead space, which is unnecessary and outside the sealing area SA.

The alignment mark 300 may include a plurality of marks. For example, the alignment mark 300 may include a rod-shape first mark 301 including two long sides parallel to the X direction and/or a rod-shape second mark 302 including two long sides parallel to the Y direction. The first mark 301 and the second mark 302 may be spaced apart. Accordingly, a central line L1 of the first mark 301 and a central line L2 of the second mark 302 may be perpendicular to each other.

The alignment mark 300 may further include a third mark 303. The third mark 303 may be an organic material pattern for testing, which may be formed prior to or simultaneously with the formation of an organic emission layer. The third mark 303 may include a same material as that of the organic emission layer. One or more third marks 303 may be formed for each color pixel.

In relation to the third mark 303, by using the position relationship between the first mark 301 and the second mark 302, the alignment error between the substrate 100 and a deposition mask may be determined. For example, distance differences in the X direction and the Y direction, between the point where the central line L1 of the first mark 301 intersects the central line L2 of the second mark 302 and the center of the third mark 303, may be defined as the alignment error between the substrate 100 and the deposition mask. In order to detect the alignment error between the substrate 100 and the deposition mask, an opening corresponding to the third mark 303 may be formed in the deposition mask, which is an organic material pattern for testing, in addition to the openings corresponding to the organic emission layer. The opening corresponding to the third mark 303 may have the same size, shape, and alignment direction as the openings corresponding to the organic emission layer.

The alignment mark 300 may further include a fourth mark 304, in addition to the first to third marks 301 to 303. The fourth mark 304 is for verifying the alignment between the substrate 100 and measuring equipment, and may have a cross shape.

The above described plurality of marks may be disposed to be parallel to the Y direction, which is a length direction of the sealing member 400. The plurality of marks may constitute one or more columns, which are each perpendicular to the Y direction. For example, as shown in FIG. 3, the first mark 301 and the second mark 302 may be in different columns and spaced apart from each other. Accordingly, several third marks 303, which are organic material patterns for testing, may be formed outside of the active area AA.

In this regard, the position, number, shape of the plurality of marks are not limited to the described exemplary embodiments, but may vary depending on a design.

FIG. 3 illustrates that the sealing member 400 includes the recess 411, which is concave in a direction from the edge E of the substrate 100 to the active area AA. However, the sealing member 400 may include a recess formed in the opposite direction.

Referring to FIG. 4, the sealing member 400 may include the recess 411, which is concave in a direction from the active area AA of the substrate 100 to the edge E of the substrate 100. The shape of the sealing member 400 may be the same as the shape of the sealing member where the sealing member 400 illustrated in FIG. 3 is symmetrically rotated about a central line LS of the sealing area SA.

Therefore, the alignment mark 300 may be disposed between the concave recess 411 of the sealing member 400 and the active area AA.

Figure 5:
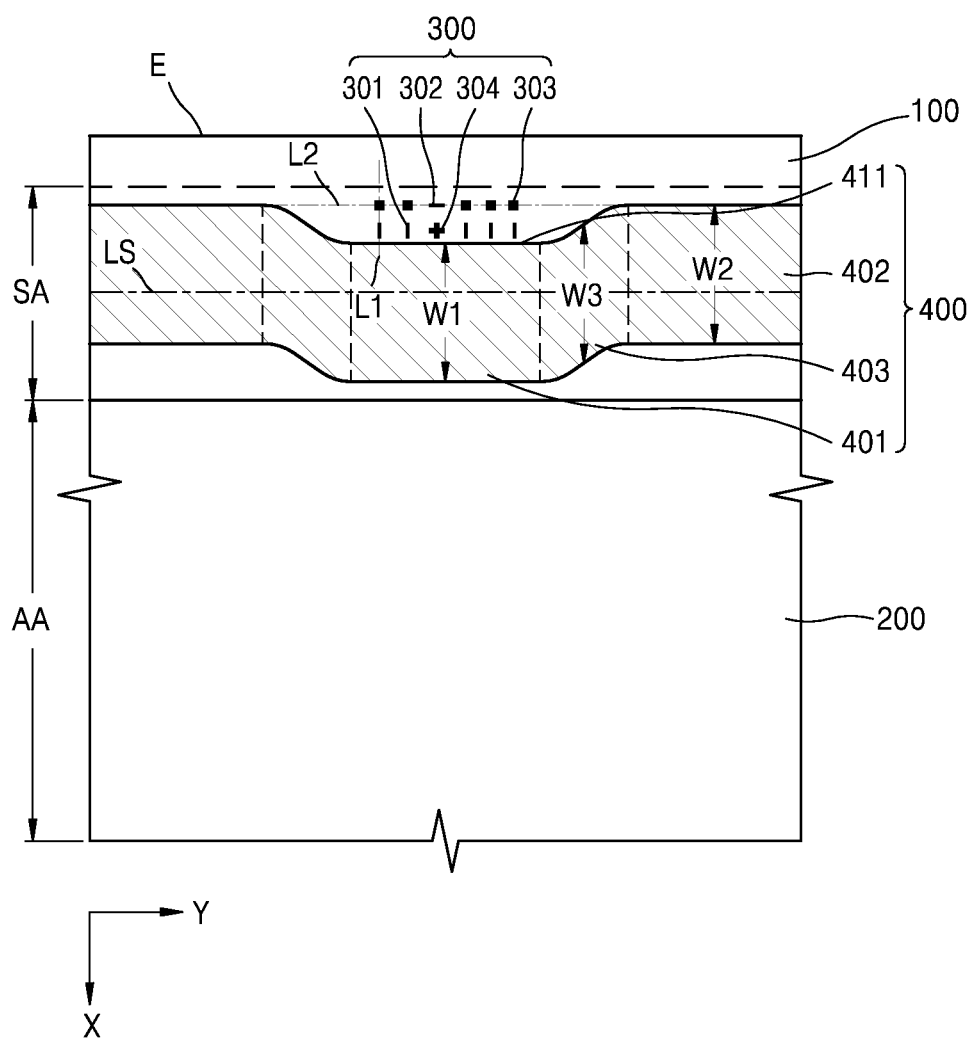
FIG. 5 is an enlarged schematic view of a portion of a display apparatus according to still another exemplary embodiment of the inventive concept.
Figure 6:
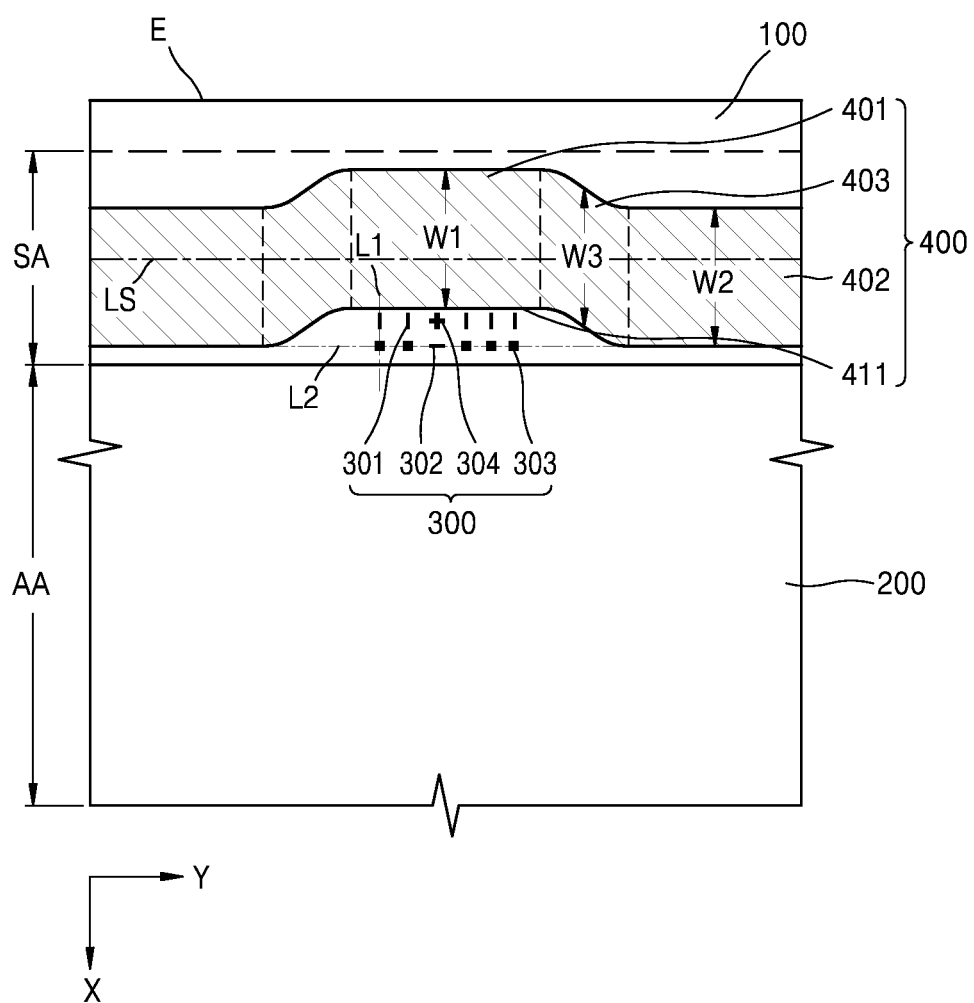
FIG. 6 is an enlarged schematic view of a portion of a display apparatus according to still another exemplary embodiment of the inventive concept.

FIGS. 5 and 6 are schematic enlarged views of a portion of a display apparatus according to still another exemplary embodiment of the inventive concept. Hereinafter, with reference to FIGS. 3 and 4, descriptions of portions that are the same or similar to the above described portions will not be repeated for convenience. The same is applied to the following examples and modifications.

Referring to FIG. 5, the sealing member 400 may include the recess 411, which is concave in a direction from the edge E of the substrate 100 to the active area AA. For convenience of explanation, with regard to the sealing member 400, a portion where the recess 411 is located is referred to as the first portion 401, a portion adjacent to the first portion 401 is referred to as the second portion 402, and a portion between the first portion 401 and the second portion 402 is referred to as the third portion 403.

The width W1 of the first portion 401, the width W2 of the second portion 402, and the width W3 of the third portion 403 may be the same as one another. In other words, the width of the sealing member 400 may be constant along the whole length of the sealing member 400. FIG. 5s illustrates that both edges of the third portion 403 of the sealing member 400 are curved, but the exemplary embodiments are not limited thereto. That is, both edges of the third portion 403 may be straight.

The alignment mark 300 may be disposed between the concave recess 411 of the sealing member 400 and the edge E of the substrate 100. Accordingly, at least one portion of the alignment mark 300 may be disposed on the sealing area SA, helping to align the substrate 100 with a deposition mask and reduce a dead space.

FIG. 5 illustrates that the sealing member 400 includes the recess 411, which is concave in a direction from the edge E of the substrate 100 to the active area AA. However, the sealing member 400 may include a recess formed in the opposite direction.

Referring to FIG. 6, the sealing member 400 may include the recess 411, which is concave in a direction from the active area AA of the substrate 100 to the edge E of the substrate 100. The shape of the sealing member 400 may be the same as that of the sealing member 400 illustrated in FIG. 5, where the sealing member 400 is symmetrically rotated about the central line LS of the sealing area SA. Therefore, the alignment mark 300 may be disposed between the concave recess 411 of the sealing member 400 and the active area AA.

Figure 7:
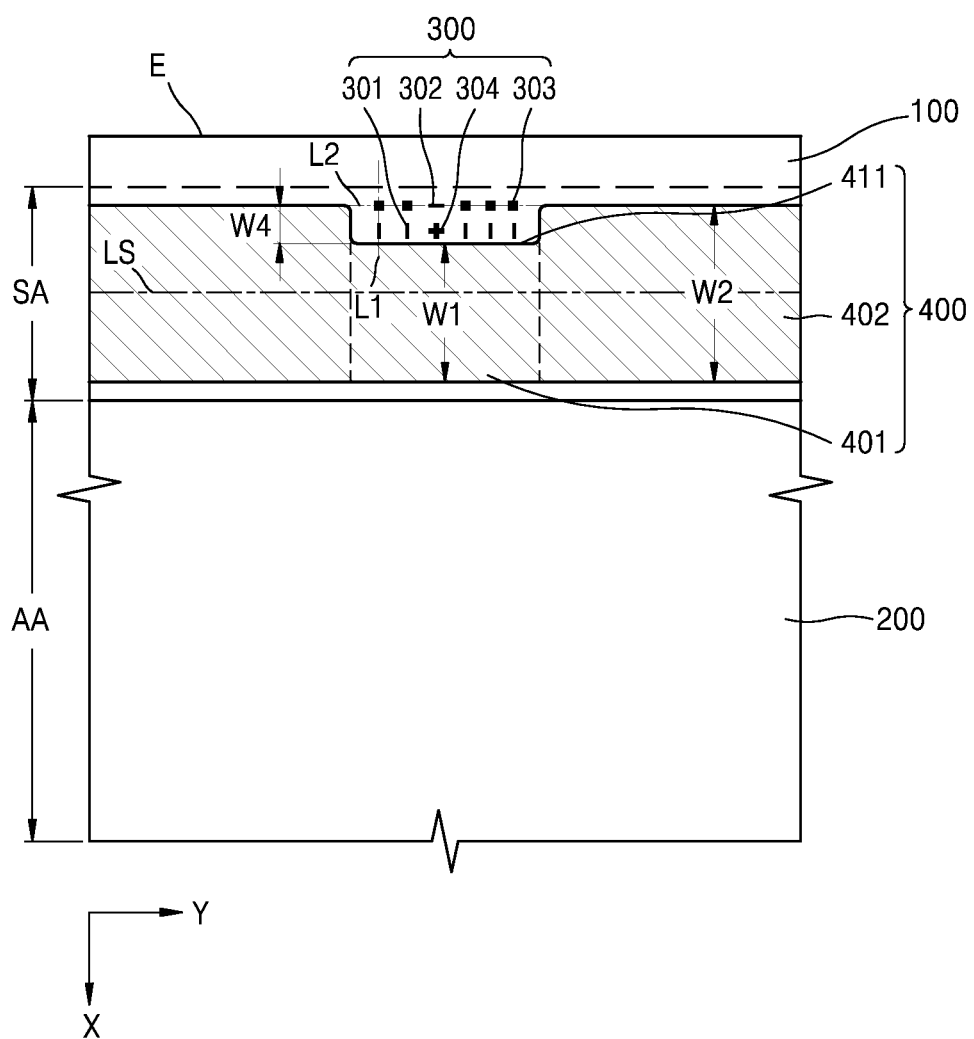
FIG. 7 is an enlarged schematic view of a portion of a display apparatus according to still another exemplary embodiment of the inventive concept.
Figure 8:
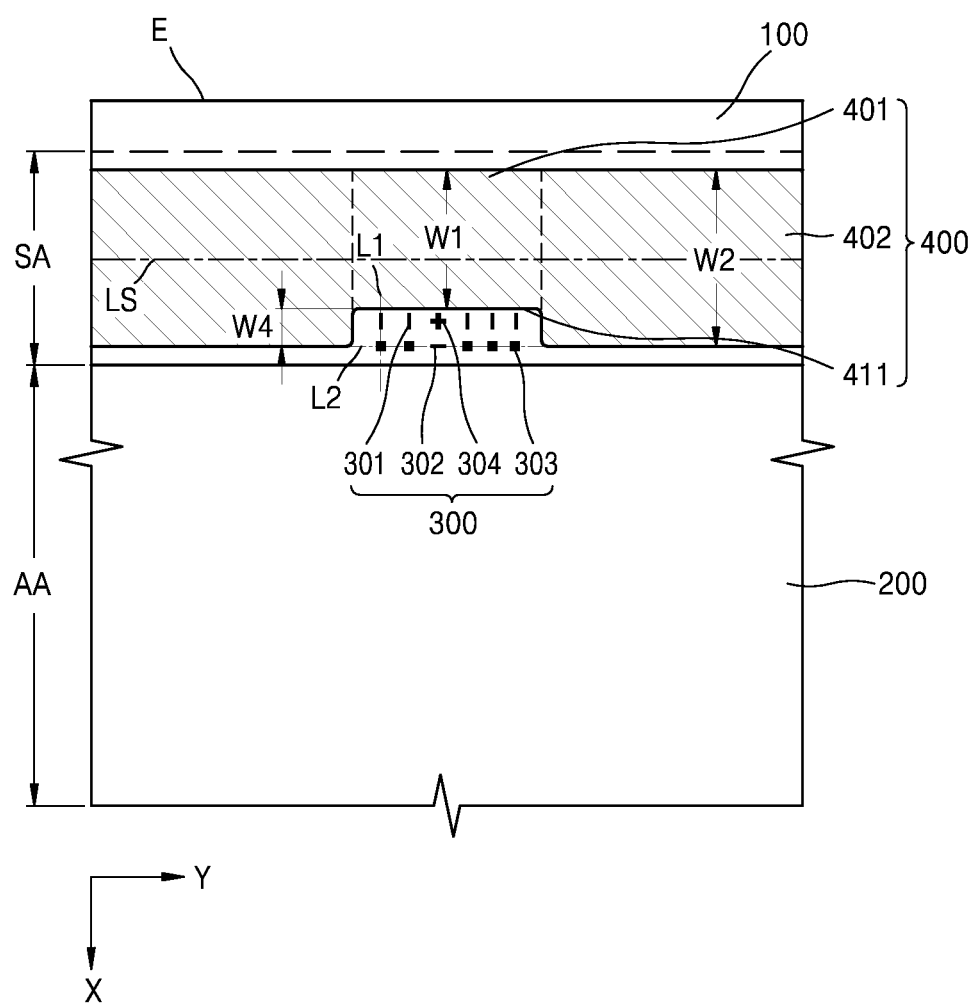
FIG. 8 is an enlarged schematic view of a portion of a display apparatus according to still another exemplary embodiment of the inventive concept.

FIGS. 7 and 8 are schematic enlarged views of a portion of a display apparatus according to still another exemplary embodiment of the inventive concept. Hereinafter, with reference to FIGS. 3 and 6, descriptions of portions the same or similar to the above described portions will not be repeated for convenience.

Referring to FIG. 7, the sealing member 400 may include the recess 411, which is concave in a direction from the edge E of the substrate 100 to the active area AA. For convenience of explanation, with regard to the sealing member 400, a portion where the recess 411 is located is referred to as the first portion 401 and a portion adjacent to the first portion 401 is referred to as the second portion 402

The width W1 of the first portion 401 may be less than the width W2 of the second portion 402.

The alignment mark 300 may be disposed between the concave recess 411 of the sealing member 400 and the edge E of the substrate 100. In the sealing member, the edges of the first portion 401 and the second portion 402 on a side of the active area AA may be aligned in a straight line. Accordingly, the width W1 of the first portion 401 may correspond to the difference between the width W2 of the second portion 402 and a width W4, which is a width in the X direction of the recess 411.

Accordingly, at least one portion of the alignment mark 300 may be disposed on the sealing area SA, helping to align the substrate 100 with a deposition mask and to reduce a dead space. Because the alignment mark 300 is formed on a portion of the substrate 100, the length (in the Y direction) of the first portion 401, which may have a decreased width of the sealing member 400 due to the alignment mark 300, may be much less than the entire length of the sealing member 400. Therefore, even if the sealing member 400 has the first portion 401, problems, such as a decrease of adhesion between the substrate 100 and an encapsulation substrate, may not arise.

In FIG. 7 illustrates that the sealing member 400 includes the recess 411, which is concave in a direction from the edge E of the substrate 100 to the active area AA. However, the sealing member 400 may include a recess formed in the opposite direction.

Referring to FIG. 8, the sealing member 400 may include the recess 411, which is concave in a direction from the active area AA of the substrate 100 to the edge E of the substrate 100. The shape of the sealing member 400 may be the same as that of the sealing member 400 illustrated in FIG. 7, where the sealing member 400 is symmetrically rotated about the central line LS of the sealing area SA. Therefore, the alignment mark 300 may be disposed between the concave recess 411 of the sealing member 400 and the active area AA.

As described above, the display apparatus according to an exemplary embodiment may have increased mask position precision with regard to a substrate, and have a decreased dead space on the substrate.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. A display apparatus comprising:
    a substrate comprising an active area and a sealing area surrounding the active area;
    a display unit disposed on the active area of the substrate; and
    a sealing member comprising a first portion, a second portion, and a third portion, the third portion disposed between the first portion and the second portion and connecting the first portion to the second portion,
    wherein:
    the first portion is located closer to the active area than the second portion; and
    the first portion and the second portion extend in a first direction and the third portion extends in a second direction different from the first direction.

2. The display apparatus of claim 1, wherein a width of the third portion is substantially equal to a width of the first portion and a width of the second portion.

3. The display apparatus of claim 1, wherein the sealing member is first curved from the first direction to the second direction substantially perpendicular to the first direction, and then curved from the second direction to the first direction.

4. The display apparatus of claim 3, wherein the first direction is a length direction of the sealing member, and the second direction is a width direction of the sealing member.

5. The display apparatus of claim 1, further comprising:
an alignment mark disposed between the first portion and the edge of the substrate.

6. The display apparatus of claim 5, wherein the alignment mark comprises a plurality of marks, and at least one of the marks is arranged parallel to the first direction.

7. The display apparatus of claim 5, wherein the alignment mark comprises an organic material.

8. The display apparatus of claim 1, wherein:
the sealing area comprises four sub areas, the four sub areas comprising two first sub areas extending in a first direction and two second sub areas extending in a direction substantially perpendicular to the first direction; and
the first portion is located in a center portion of at least one of the four sub areas.

9. The display apparatus of claim 8, wherein:
the two first sub areas extending in a first direction comprise an upper sub area and a lower sub area; and
the first portion is located in a center portion of the upper sub area.

* * * * *